United States Patent

[11] 3,617,398

[72] Inventors Orest Bilous
Beacon, N.Y.
Darrell R. Meulemans, Jerico, Vt.;
Raymond P. Pecorado, Wappingers
Falls, N.Y.; Michael C. Selby,
Burlington, Vt.

[21] Appl. No. 798,511
[22] Filed Oct. 22, 1968
[23] Division of Ser. No. 480,553
July 18, 1965, Pat. No. 3,473,093
[45] Patented Nov. 2, 1971
[73] Assignee International Business Machines
Corporation
Armonk, N.Y.

[54] PROCESS FOR FABRICATING SEMICONDUCTOR DEVICES HAVING COMPENSATED BARRIER ZONES BETWEEN NP-JUNCTIONS
56 Claims, 6 Drawing Figs.

[52] U.S. Cl. .................... 148/175,
29/569, 29/571, 117/201, 148/33.3, 148/186,
148/187, 148/190, 317/234, 317/235

[51] Int. Cl. .................... H01l 7/36,
H01l 5/00, C23c 13/00

[50] Field of Search .................... 148/175,
186, 187, 33.3; 117/201; 29/569, 571, 317/234,
235

[56] References Cited

UNITED STATES PATENTS

| | | | |
|---|---|---|---|
| 3,226,611 | 12/1965 | Haenichen | 317/234 |
| 3,244,566 | 4/1966 | Mann et al. | 148/186 |
| 3,271,201 | 9/1966 | Pomerantz | 148/33.3 |
| 3,307,984 | 3/1967 | Frazier | 148/187 |
| 3,312,881 | 4/1967 | Yu | 148/186 X |
| 3,328,214 | 6/1967 | Hugle | 148/175 |
| 3,343,255 | 9/1967 | Donovan | 29/577 |

*Primary Examiner*—L. Dewayne Rutledge
*Assistant Examiner*—W. G. Saba
*Attorneys*—Hanifin and Jancin and Henry Powers

ABSTRACT: A process for forming semiconductor devices by forming in a semiconductor substrate of one conductivity type a diffused region of a second conductivity type circumscribed by an adjacent gold compensated intrinsic region INVENTORS
OREST BILOUS
DARREL R. MEULEMANS
RAYMOND P. PECORARO
MICHAEL C. SELBY
BY [signature]
ATTORNEY

PROCESS FOR FABRICATING SEMICONDUCTOR DEVICES HAVING COMPENSATED BARRIER ZONES BETWEEN NP-JUNCTIONS

This application is a division of copending Pat. application Ser. No. 480,553, filed Aug. 18, 1965, now U.S. Pat. No. 3,473,093 granted Oct. 14, 1969.

This invention relates to semiconductor devices of the type especially suitable for use as fast operating switches and to the process for making such devices.

One major problem encountered in the design of a suitable switching device for computers is fulfilling the requirement of switching time without adversely affecting other parameters. In particular, if the capacity of a switching device, for example, a diode, is made sufficiently small by the use of a lightly graded junction and a small junction area, the lower limit of the transient response is set by the turnoff time (the time required to sweep out excess minority carriers above those present in the steady state "OFF" condition). The minimization of junction area and the use of a lightly graded junction, however, conflicts directly with the requirement that a switching device have a low forward recovery voltage and approach as closely as possible the ideal DC voltage-current characteristics. These criteria imply a large area and a sharply graded junction. Thus, a series of design comprises are necessary if a useful switching device is to be realized.

A switching device may be viewed as a parallel circuit comprising capacitance ($C_t$) which is the depletion layer capacitance associated with the space charge region of a junction, and R which is the impedance of a diode under conditions of reversed bias. A resistance $Rx_s$ is in series with the parallel circuit and is dependent upon the semiconductor resistivity, diode geometry and contacts. For a relatively low capacitance, of the order of 0.5 *pf*, the junction area must be extremely small and the contact holes even smaller. The diffusion profiles must be shallow so that peripheral capacitance effects can be minimized. It can be shown for a diode capacitance per unit area of 0.06 pf. per mil square, the diffusion area is of the order of 1 mil and the contact hole is of the order of 0.5 mils. Moreover, increasing the bulk resistivity in an attempt to lower the capacitance area is not advantageous since low doped P-type surfaces are very susceptible to inversion phenomena. Devices of the type described have been found to have capacitance of the order of 0.94 pf. whereas devices having capacitance of the order of 0.6 pf. are necessary for high-speed switching operation.

A general object of the present invention is an improved semiconductor device structure which has low capacitance and forward recovery voltage and excellent reverse recovery characteristics.

Another object is a semiconductor switching device having a current dependency based upon the junction perimeter.

Another object is an improved semiconductor-switching device which permits contacts to be larger than the active area of the device.

Another object is a semiconductor-switching device having a diffused junction which presents minimum peripheral capacitance.

Another object is a semiconductor device having a PN-PIN junction.

Another object is a method of making an improved semiconductor device having low depletion capacitance and forward recovery voltage and good reverse recovery.

Another object is an improved method for making an ideal high beta switching element for information handling apparatus.

These and other objects are accomplished in accordance with the present invention, one illustrative embodiment of which comprises epitaxially depositing on the surface of a P+ silicon substrate a relatively slightly doped (2.0 ohm-cm.) N-type material. An insulating layer, typically silicon dioxide is grown or otherwise formed on the surface of the epitaxial silicon. A conventional photolithographic operation is employed to establish islands of silicon dioxide on the surface of the wafer. The exposed N-type silicon is subjected to a highly doped P-type atmosphere (boron diffusion) to establish a P+ area in the openings. The diffused P+ area contacts the original P+ crystal. The surface is reoxidized with silicon dioxide or the like and an opening is established in the oxide in a position over the N-type silicon. A phosphorous diffusion is conducted through the openings to cause the volume underneath to become highly N-type. The highly N-type and P-type material form a junction which is bounded by an N-type region. The inverse side of the wafer is lapped and polished prior to the evaporation of approximately 100 Angstroms of gold on the surface thereof. The gold is diffused into the wafer at 1,250° C. for 20–25 minutes in nitrogen. After the gold diffusion, the wafer is cleaned with a polishing cloth and trichlorethylene. The gold diffusion compensates the low doped N-region and turns it into an intrinsic region. Additionally, the N+ and P+ regions establish an abrupt junction. The resulting structure now has two distinct junctions. One is the normal P+N+ junction and the other is the P+IN+ junction. The P+N+ interface insures extremely low forward recovery transient and a steep junction diode characteristic. The peripheral capacitance of the device is negligible because of the wide intrinsic region which results in relatively low depletion capacitance of the order of 0.5 *pf*. The contact hole for the junction need not be contained in the junction area because of the intrinsic region.

One feature of the invention is that the current through the PIN-junction is far greater than that through NP-junction which renders the device current directly proportional to the junction perimeter rather than the area as in the case of prior art devices.

Another feature of the invention is that the voltage and field distributions in the intrinsic region are a function of the width of the intrinsic region (W) to the diffusion length (L) ratio and for the condition that W/L less than one, the voltage drop in the intrinsic region is negligible.

Still another feature of the invention is employing a W/L ratio of the order of one to permit the intrinsic region a good recovery time.

Still another feature of the invention is the use of a PN-junction and a PIN-junction where the transient current initially flows through the PN-junction and as steady state current conditions are approached the PIN-junction absorbs more and more of the current-carrying capability until all of the current flows to the PIN-junction.

The foregoing and other objects, features and advantages of the invention will be apparent from the following, more particular description of preferred embodiments of the invention as illustrated in the accompanying drawings.

Figure 1:
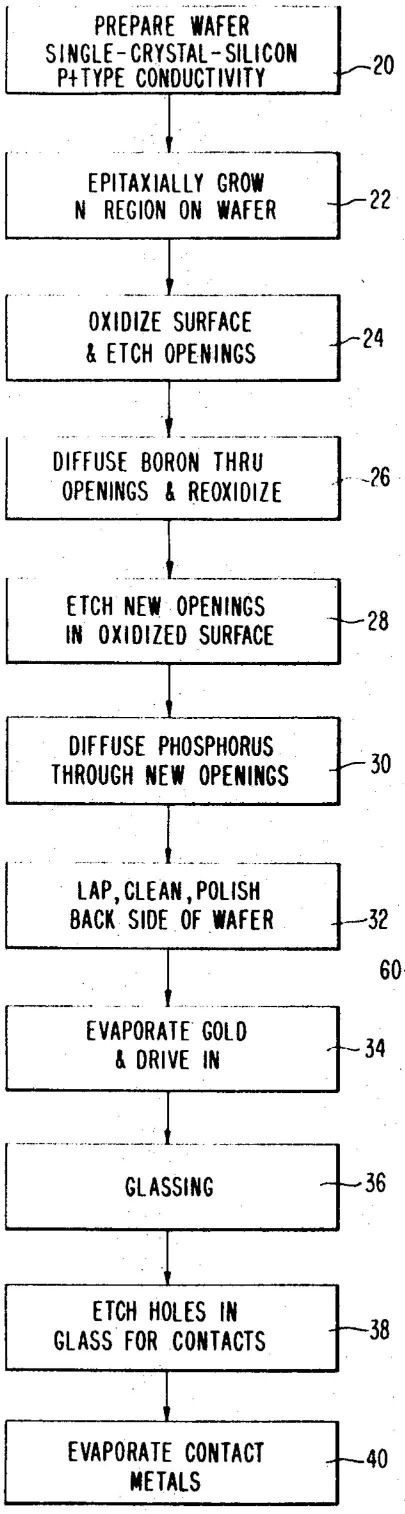
FIG. 1 is a process diagram for the fabrication of the present invention.
Figure 2:
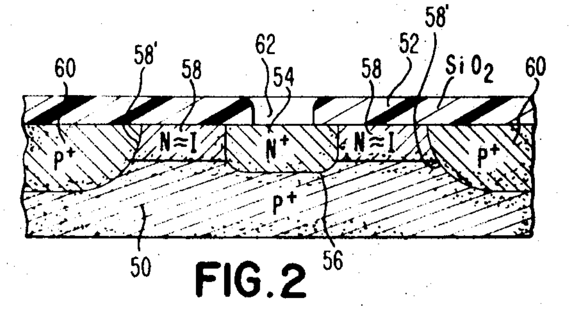
FIG. 2 is a cross-sectional view of a semiconductor device of the present invention.

Turning to FIG. 1 a process for fabricating the semiconductor device of the present invention comprises a first operation 20 which involves the preparation of a single-crystal silicon wafer having a P+ conductivity. Generally the wafer is prepared by taking a transverse slice from a single crystal of silicon produced in any one of a number of ways well known in the art. The doping of the wafer is of the order of $10^{19}$ atoms per $cm.^3$ where the dopant is taken from the group consisting of boron, aluminum, and gallium. The dopant is introduced into the silicon while in a melted state prior to a crystal pulling operation. The largest slice obtainable from the crystal after pulling will have a diameter of about 1 inch. The slice will have a resistivity of about 0.15 ohm cm. The slice is prepared for further processing by a conventional lapping and chemical cleaning technique so as to have two substantially parallel faces with a thickness therebetween of the order of 0.010 inches. From this slice a relatively large number of individual devices similar to that shown in FIG. 2 are fabricated, as explained hereinafter.

As a second operation 22, an N-type epitaxial layer of the order of 2 ohm-cm is grown on the P+ silicon substrate. The silicon wafer is loaded on a carbon disc and placed in a deposition chamber which is flushed with nitrogen at a preselected rate and time. A hydrogen flush cleans the chamber of all nitrogen. The chamber is raised to 1,140° C. and silicon tetrachloride is passed through hydrogen and enters the chamber. The dopant, typically phosphorous chloride, (N-type) or the like in gaseous form, is also introduced into the chamber. A chemical reaction occurs in the chamber and elemental silicon doped with the N impurity is integrally grown on the wafer until a thickness of 0.25 mils is realized.

The next operation 24 involves the application of an oxidation film to the surface of the wafer followed by the etching of openings in the film. The oxidation of the film may be produced by thermal growth, evaporation or anodization. In thermal growth, for example, the wafer, disposed on a suitable carrier, is loaded into a quartz furnace which is adapted to admit dry oxygen and steam. The oxygen is permitted to flow after which steam is admitted instead of oxygen. The furnace is operated at a temperature of 970° C. while the steam and oxygen cycle last approximately 90 minutes. This interval permits thin oxide films of the order of 5,500 Angstroms thickness to develop on the wafer. The wafer is removed from the furnace and cooled for at least 15 minutes.

Afterwards a suitable photographic resistant material is applied to the surface thereof. The photoresist material may be any one of the compositions disclosed in U.S. Pats. No. 2,670,285, 2,670,286, and 2,670,287 of Louis M. Minsk et al. Also a material sold by Eastman Kodak Co., Rochester, N.Y., under the trademark KPR (Kodak Photo-Resist) may be applied. Conventional methods of applying such a coating may be employed, such as brushing, dipping, spraying or the like which may be followed by a whirling operation to insure uniform and thin resist layers. It is important before applying the resist material to insure a clean surface by the use of suitable cleaning agents, for example benzol, toluene or like solvents. A pattern is photographically inscribed in the photoresist by well known means. The wafer is washed and suitably cleaned which eliminates the unexposed photoresist material. Thereafter, the wafer is subjected to an etchant which will attack the silicon dioxide coating, but leave unaffected the photoresist material. This leaves a bare silicon surface so that the portion exposed can later receive a suitable diffusion. One suitable etchant is a combination of ammonium fluoride ($NH_4F$) and hydrofluoric (HF) acid. Typically 10–30 parts of ammonium fluoride to 1–4 parts of hydrofluoric acid are combined depending upon the impurity desired to be diffused into the wafer. The etching interval is in the range from 5½–8 minutes.

Afterwards, the wafers are removed from the solution and placed under distilled water for at least 30 seconds to 2 minutes. The clean surface is dried by air for approximately 30 seconds.

The oxidized wafer is now ready to receive a boron diffusion in an operation 26. A source of boron doped silicon, typically having a resistivity of the order of 0.0025 ohm cm. is loaded into a capsule with the wafer. The capsule is evacuated and sealed prior to a placement into a diffusion oven. The capsule is inserted into the center of the flat zone of the oven for 50 minutes. Thereafter, the capsule is removed and immediately quenched under running tap water. The wafers are removed from the capsule, after opening, and inspected for resistivity and junction profile. The boron diffusion results in the N-type regions under the openings being converted to P+ type conductivity. The diffusion time is selected to permit the P+ region to join the original P+ crystal. This time is of the order of 4½hours for a furnace temperature of the order of 1,175° C. The wafer is reoxided in the manner described in the operation 24 after P+ boron diffusion.

Etching of suitable apertures in the reoxidized coating on the wafer occurs in operation 28. These openings are 0.6 or 0.8 mil diffusion holes using the standard photoresist techniques described in the operation 24. The 0.6 mil hole is open only if a 1.5 mil contact hole is planned to be used. A 0.8 mil hole is used only if a 0.6 mil contact hole is planned for a glass coating to be described hereinafter.

An operation 30 is subsequently performed which diffuses N-type material, typically phosphorus, into the openings in the oxide coating. A source of phosphorus pentoxide ($P_2O_5$) is loaded into a source boat and positioned in a three zone furnace. At the end of 30 minutes the source is pulled into a cold zone of the furnace (approximately 150° C.). The wafers are loaded into a diffusion boat and inserted into the preheat zone of the furnace which is at approximately 850°. After the preheat cycle, the $P_2O_5$ source is returned to the 300° C. zone of the furnace and at the end of 10 minutes the diffusion boat is inserted into the 1,000° zone of the furnace. A phosphorous diffusion occurs for approximately 8 minutes while the $P_2O_5$ source material is held at 300° for 5 minutes. After the 5 minute interval the source is pulled back into the cold zone. The phosphorous diffusion results in a junction depth of the order of one-tenth of a mil. At the end of the diffusion time the wafers are removed from the furnace and cooled, inspected prior to further processing.

A pregold diffusion operation 32 is performed wherein the inverse of the wafer is lapped and sandblasted. Typically, a wafer is blasted with a suitable grit until a uniform matte finish is observed. Any shiny areas are blasted again. The wafers are rinsed under distilled water and dried on a hot plate. A cleaning operation is performed by polishing both sides of the wafer with a mirror cloth and alcohol. To remove all visible wax, trichloroethylene or alcohol is applied to the surface of the wafer at room temperature for at least 1 minute. The wafers are dried prior to further processing.

A gold evaporation and drive-in operation 34 is performed to place a layer of gold on the inverse of each wafer. The gold is diffused in the wafer during a subsequent heating cycle. The evaporation is done in a conventional evaporator. The wafers are loaded into the bell jar which is placed under a vacuum of the order of $2.5\times10^{16}$ mm. of mercury. The evaporation takes place at 600° C. for a period of time sufficient to permit 100 Angstroms of gold to be deposited on the wafer. The wafers are removed from the bell jar and readied for a gold diffusion which takes place in an oven. The oven is operated at a temperature of the order of 1,250° C. for 20 minutes. The gold concentration is about $10^{15}$ to $10^{17}$ atoms per cubic centimeter. The gold serves a triple purpose. First, it introduces a large number of trapping centers into the silicon material which act as recombination centers and in such a way minimizes device storage time. Secondly, the gold compensates the low doped N region and turns it intrinsic. Thirdly, the time and temperature of the gold diffusion allow the N+ and P+ regions of the device to meet and form a junction.

After the gold diffusion a glassing operation 36 is performed. In one form, a glass mixture comprising 10 grams of a lead borosilicate glass with 30 ml. isopropyl alcohol is ultrasonically agitated for 10 minutes. After 24 hours soaking, an ethyl acetate is added and the mixture is ultrasonically agitated for 10 minutes. The mixture is centrifuged and the concentration reduced to 0.00205 grams per 10 cc. in an acetate solution. The concentration is poured into a container and the wafers added. The container is centrifuged at 3,000 r.p.m. for 3 minutes to deposit uniformly the glass suspension on the wafers. The mixture is decanted and the wafers dried. The dried wafers are fired in a tube furnace at 1,250° C. for 2 minutes. The glass coated wafers are removed from the furnace and cooled. Subsequently, the wafers are recoated with the same glass suspension to produce a final glass thickness of about 3.0 microns. Further details relative to the glassing are given in previously filed applications, Ser. Nos. 141,669 and 141,668, filed Sept. 29, 1961, now U.S. Pat. 3,247,428 and Sept. 29, 1961, now U.S. Pat. No. 3,212,921, respectively, and assigned to the same assignee as that of the present invention.

An etching operation 38 is next performed to establish contact holes through the glass and silicon dioxide to the silicon electrodes. As a first step, approximately 500 to 1,000 Angstroms of chromium are evaporated on the wafer at room temperature. A photoresist material is next applied to the deposit of chromium. The resist must be hydrofluoric resistant. One resist found to be suitable is Kodak Metal Etch Resist (KMER) a product of Eastman Kodak Co., Rochester, N.Y. The Photoresist is deposited on the chromium by the technique described in the operation 28. A pattern is inscribed in the resist by well known photographic techniques. The wafer is cleaned to expose the metal. The exposed chromium is etched by a solution comprising approximately 20 grams of potassium ferric iron cyanide, ($K_3Fe(CN)_6$ sodium hydroxide and water for 2½ to 5 minutes depending on the thickness of the chromium. The exposed glass is etched in a solution comprising hydrofluoric acid. The etch is applied for approximately 60 seconds after which the wafer is washed. A buffered HF etch is next applied to the wafer to dissolve the silicon dioxide and expose the silicon electrodes. The wafer is held in the buffered hydrofluoric acid for about 6 minutes. Following washing, the wafer is ready to receive contact metals.

The metal contacts are placed on the device in an operation 40. Following the etching operation, gold or paladium is evaporated at about 200° C. to a thickness of 6,000A. The metal etch resist is removed by a hot trichloroethylene solution prior to further processing. Gold or paladium peels off with the photoresist remaining only in exposed silicon holes. The chromium is exposed on the surface of the wafer along with the gold or platinum. The gold is alloyed at around 400° C. for 5 minutes. A series of metals are deposited on the chromium to complete the contact metallurgy. Chromium, copper and gold evaporation are successively made through a mask to the wafer. The evaporator is a conventional construction. In one form, a 210 mgr. chromium charge is displaced on tungsten strips of the evaporator. 850 mgr. of copper and 460 mgr. of gold are placed in the front and rear boats. The evaporator is pumped down to $5\times10^{16}$ mm. pressure. The wafers are heated to 180°. The copper is outgased by raising the temperature to the melting point. 75 percent of the chromium charge is evaporated first. The copper evaporation starts to overlap the chromium. The gold is evaporated to complete the evaporation. The chromium deposit has a thickness of the order of 1,500 Angstroms and establishes a glass-metal seal thereby completing the encapsulation of the junction and the devices. The copper and gold deposits have thicknesses of the order 5,000 Angstroms each. The copper and gold metals permit solderable metals to adhere to the chromium sealing film.

The wafers are removed, from the evaporator, cooled and forwarded to a lead-tin evaporator. A lead-tin charge is placed in the evaporator. The wafers are loaded in the evaporator which is pumped down to $5\times10^{16}$ inches of mercury. The evaporation lasts 8–10 minutes and the low eutectic metal is alloyed to the gold-copper-chromium film. No deposit occurs in the other areas of the wafers due to metal mask. The wafers are removed from the evaporator, cooled and separated from the metal mask. A lead-tin evaporation will enable a reflow joint to be established with a substrate. After inspection, the wafers are forwarded for cleaning in fluoboric acid, hydrogen peroxide and distilled water to remove all the remaining traces of chromium, copper, gold, lead and tin. Subsequently, the wafer is diced into individual devices, one of which is shown in FIG. 2.

Figure 2A:
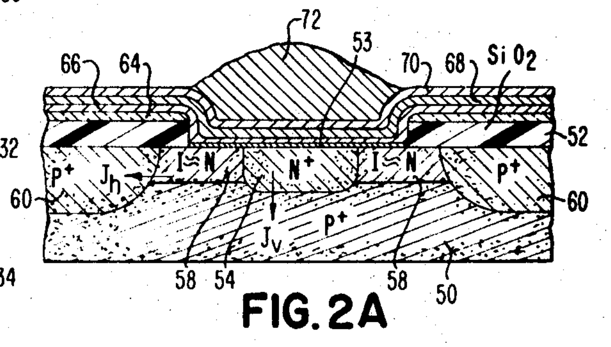
FIG. 2A is the device of FIG. 2 with contacts added.

The final device, shown in FIG. 2, resulting from the process of FIG. 1 comprises a wafer 50 having a silicon dioxide coating 52, and an N+ region 54 of approximately 0.6 mils width surrounded by an intrinsic region 58 of the order of 1.8 mils in total width. The N+ concentration is about $10^{21}$ atoms/cubic centimeter. The impurity concentration in the intrinsic region is about $10^{12}$ to $10^{13}$ atoms per cubic centimeter. The P+ concentration is $10^{19}$ atoms/cubic centimeter. A P+N+ junction 56 is established in the wafer at a depth of 0.18 mils from the upper surface thereof. An opening 62 is in the oxide coating. The intrinsic region 58 separates the sides of the N+ region 54 from the boron diffused region 60. The P+N+ region establishes a second junction 58' in the device. The interaction of junctions 56 and 58' results in a device that has high-switching speed, low depletion capacitance, low reverse recovery and ideal DC voltage-current characteristics, for the reasons indicated in the remaining paragraphs. The device is further coated with a glass film 64, as shown in FIG. 2A, to offset the hydrophilic characteristic of the film 52. A gold contact 53 covers the exposed region 54 and 58. A chromium film 66 covers the glass film 64 and the contact 53. Gold and copper films 70 and 68, respectively lay the foundation for a lead-tin contact 72.

The basis for the improved device operation is due in part to the current conditions in the device. It can be shown that two currents $J_h$ and $J_v$ (see FIG. 2) flow in the device, the $J_h$ current being horizontal and flowing in the PIN-direction and the $J_v$ being vertical and flowing through the P+N+ junction. Under conditions of forward bias, the vertical current $J_v$ is as follows:

$$J_V=\frac{qD_n n_i^2}{L_n P}\cdot\beta^V \qquad (1)$$

where $J_V$= vertical current, $q$= electronic charge, $D_n$= diffusion constant for electrons, $n$= density of electrons in the intrinsic regions, $L_n$= diffusion length for electrons, $P$= the average doping over a distance of several diffusion lengths from the edge of the depletion layer, $\beta$ = Boltzman constant at room temperature, and $V$= the direct current forward bias voltage.

The PIN or horizontal current for W/2L >> 1, where W = space width and L = diffusion length, is as follows:

$$J_H=\frac{2qn_i\sqrt{\mu_n\mu_p}}{L_i}\cdot\beta\,\frac{(V_1+V_2)}{2} \qquad (2)$$

where $\mu_n$= mobility of electrons, $\mu_P$ = mobility of holes, $L_1$ = the diffusion length of electrons in the intrinsic region, $V_1$= DC voltage at one end of the intrinsic region, $V_2$= DC voltage at the other end of the intrinsic region, the remaining parameters being the same as those indicated in connection with equation 1.

Figure 3:
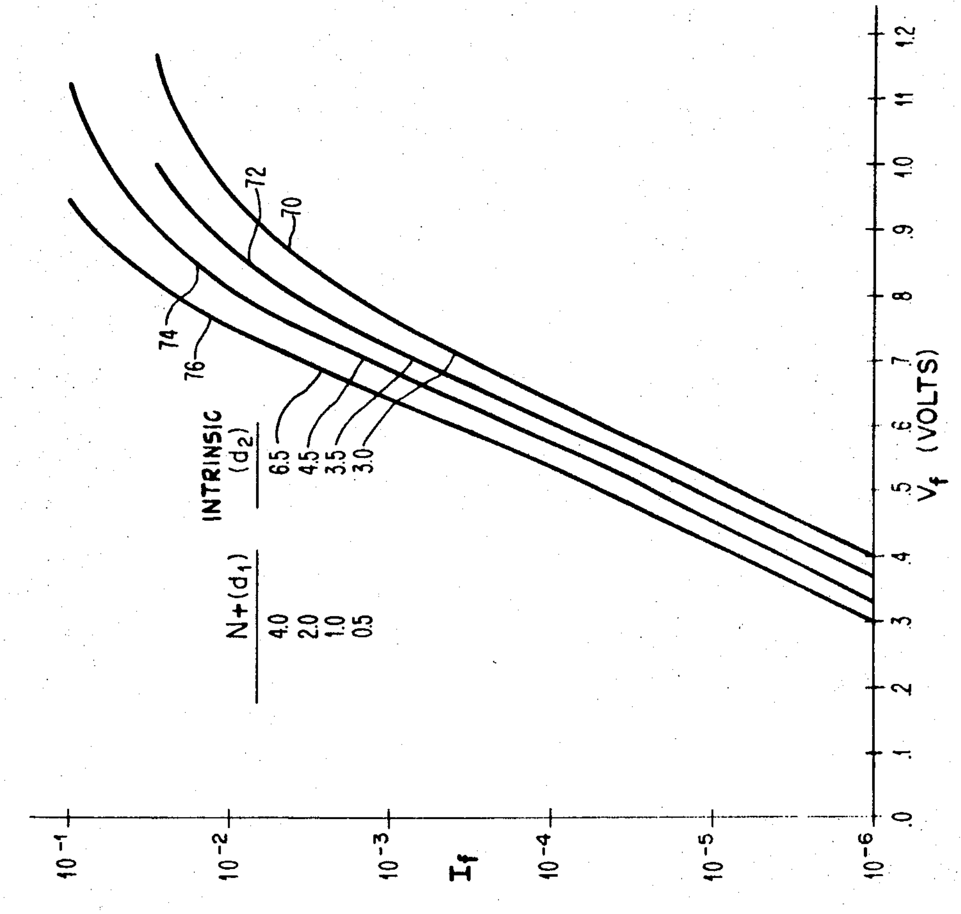
FIG. 3 is a graph showing forward current versus applied voltage for the semiconductor device of the present invention.

Taking the ratio of $J_H$ to $J_V$ it can be shown for a $\beta$ proportion to 40 volts[11] power, $D_p$ proportional to 10 cm.$^2$ per sec., $n_i$ proportional $1.5\times10^{10}$ cm.$^{13}$, $\mu_n$=2$\mu_P$=3,600 cm.$^2$ per volt second and P proportional to $10^{18}$, the PIN-junction current is far greater than that of the PN-junction. Since the ratio is so large, the vertical current or the current through the NP-junction may essentially be neglected. This fact leads to the conclusion that the device current is directly proportional to the junction diameter. This may be further verified by referring to FIG. 3 wherein the forward current of the device is listed for applied voltages wherein the ratio of the intrinsic region overall width to the electrode width is varied. FIG. 3 demonstrates that the device forward current is directly proportional to the junction perimeter and not the junction area. Curves 70, 72, 74, and 76 are for different diameters of intrinsic and N+ regions, indicated therein. The rounding of the voltage curves in the region of 1.0 volt forward bias is due to the resistive components of the bulk material. That is, to obtain the same device current, the applied voltage of device terminals must be increased to compensate for the voltage drop in the bulk of the diode material.

The reverse recovery time of the device, which is proportional to the depletion capacitance, is improved over conventional devices. It can be shown that the reverse recovery time of the present device is as follows:

$$erf\sqrt{t/T}=\frac{1}{2\left(1+\frac{I_R}{I_F}\right)} \qquad (3)$$

where $erf$ = error function, $t$ = storage time, $T$ = lifetime, $I_F$ = forward current, and $I_R$ = reverse current.

The recovery time of simple PN-junctions, as indicated in an article entitled "Diode Storage Time Calculations" by M. Klein, IBM Technical Note TN00481, dated Dec. 6, 1960, is as follows:

$$\text{erf}\sqrt{t/T}=\frac{1}{\left(1+\frac{I_R}{I_F}\right)} \quad (4)$$

Comparing equation 3 with 4 it is apparent that the device containing the PIN-structure is more than twice as fast in recovery as the simple PN-diode. Since the majority of the steady state current flows through the PIN-junction, the depletion capacitance of the present device is approximately half of that of the regular device.

Figure 4:
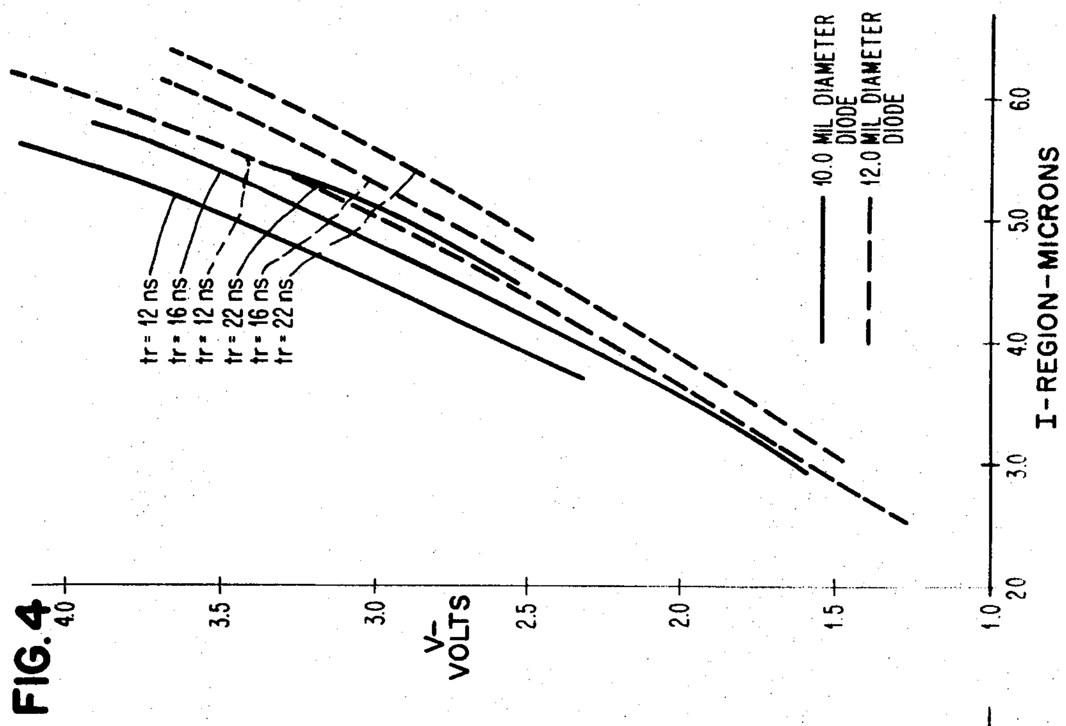
FIG. 4 is a graph showing the forward recovery voltage versus intrinsic layer thickness and gold doping density for the device of the present invention.

It would appear that a PN-junction in the device is relatively inactive. Its activity, if anything, could be described as unwanted since, due to its highly doped concentration on both sides of the junction, it compromises all of the device capacitance and lowers the device breakdown voltage. One would, therefore, be tempted to conclude that the PN-portion of the device should be eliminated and a better device would result. The merits of a PN-junction however, become evident when the forward recovery voltage is examined. Referring to FIG. 4, devices of two different diameters (D1=10 mils, D2=12 mils) and three different lifetimes ($t_r$=12 nanoseconds, 16 ns, 22 ns) are indicated. FIG. 4 shows that the smaller the I region thickness and the larger the junction diameter the smaller will be the forward recovery voltage. The effect of the PIN-junction, therefore, becomes apparent. Since the PN-junction has no I region, all of the transient currents will flow to the PN-junction during the initial signal application. Thus, it is apparent that FIG. 4 demonstrates that the transient forward current initially flows through the PN-junction and as the diode approaches steady state, the PIN-junction absorbs more and more of the current capability until all of the current flows through the PIN-junction. The PN-junction therefore provides low forward recovery voltage which is important in high-speed switching devices.

It is important that the width of the intrinsic region (W) to the diffusion length (L) be less than one in order for the effects of the invention to be realized. It can be shown that the voltage across the intrinsic region is as follows:

$$V_I=(\pi/2)\left(\frac{KT}{q}\right)(\mu^*)e^{w/L}$$

$$\mu^*=\frac{\mu_n\mu_p}{(\mu_n+\mu_p)^2}$$

where $K$ = Boltzman constant, $T$ = temperature, $q$ = charge, $\mu$= mobility, $\mu_p$ and $\mu_n$ are as indicated in equation 2, $W$ = intrinsic width and $L$ = diffusion length.

For a W/L ratio of 5;$V_I$ =1.5 volts, Laboratory measurements, however, show that the voltage drop in the I region is nowhere near 1.5 volts but rather near 0.8 volts. Thus, the W/L ratio is less than one. It is apparent, therefore, that the horizontal current flows immediately to the P+ region immediately adjacent the junction 56. This current flow provides a negligible voltage drop. Thus, the W/L is highly instrumental in determining the path of current flow. For a ratio greater than one, the intrinsic field is sufficiently large to affect the device operation. For a W/L ratio of less than one, the intrinsic voltage drop is negligible and produces the result of low forward recovery voltage and reverse recovery voltage. The low reverse recovery is accompanied by low depletion capacitance and a linear dependence of the forward current on the diode diameter rather than the diode area. These features make the device an ideal high-speed switching element.

Figure 5:
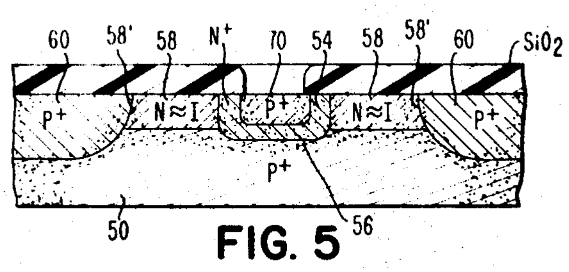
FIG. 5 is cross-sectional view of a transistor fabricated in accordance with the present invention.

Although the device described is a semiconductor diode, it is believed evident that the principles of the invention are applicable to transistors requiring low minority carrier storage as shown in FIG. 5. In addition, if a subsequent P-type diffusion 70 follows the N+ diffusion 54 (which has been used to form the P+N+ diode) then a PNP-PNIP transistor can be made. A transistor of this construction would have the following advantages: (a) high base doping—low base resistance, (b) low collector capacitance (I-region), (c) minimal base widening, (d) low lifetime (gold diffusion). Furthermore, by varying the width of the sidewall I-region, the current could be distributed either totally or symmetrically between the two transistor profiles—vertical and horizontal (PNP-PIP).

While the invention has been particularly shown and described with reference to preferred embodiments thereof, it will be understood by those skilled in the art that various changes in form and details may be made therein without departing from the spirit and scope of the invention.

What is claimed is:

1. A method of fabricating a semiconductor device from a semiconductor substrate of a first conductivity type comprising:
   - A. forming on said substrate a surface layer of a second conductivity type;
   - B. diffusing into a first portion of said layer a dopant of said first conductivity type to form a first discrete region of said first conductivity type for extension thereof into the first conductivity type portion of said substrate in a pattern circumscribing a second portion of said layer;
   - C. diffusing in a third portion of said layer contained within said second portion and spaced from said first portion a dopant of said second conductivity type to form a second discrete region of said second conductivity type for extension in PN-relationship to the first said conductivity type region of said substrate defining a PN-junction therewith, and
   - D. compensating with gold impurities the remainder of said second portion of said layer laterally contiguous between said first and second regions, to a substantially intrinsic no-conductivity type third region.

2. The method of claim 1 wherein said third portion forming said second region is diffused in a pattern defining said third region of said second portion laterally adjacent thereto with a width having a dimension less than the diffusion length thereof.

3. The method of claim 1 wherein:
   - A. the first conductivity type region of said substrate is doped to an impurity concentration of about $10^{19}$ atoms per cubic centimeter,
   - B. said layer is doped to an impurity concentration of about $10^{12}$ to $10^{13}$ atoms per cubic centimeter,
   - C. said first region is doped to an impurity concentration of about $10^{19}$ atoms per cubic centimeter,
   - D. said second region is doped to an impurity concentration of about $10^{21}$ atoms per cubic centimeter, and
   - E. said third region is compensated by about $10^{15}$ to about $10^{17}$ atoms per cubic centimeter of gold to said substantially no-conductivity type condition.

4. The method of claim 3 wherein said third portion forming said second region is diffused in a pattern defining said third region of said second portion laterally disposed thereto with a width having a dimension less than the diffusion length thereof.

5. The method of claim 1 wherein said third region laterally disposed between said first and second regions is compensated with gold to a concentration of about $10^{15}$ to about $10^{17}$ atoms per cubic centimeter to said substantially no-conductivity type condition.

6. The method of claim 5, wherein said second region is diffused in a pattern defining said third region laterally disposed between said first and second regions with a width having a dimension less than the diffusion length thereof.

7. The method of claim 1 wherein said first region, said second region and the first conductivity type region of said substrate are doped with an impurity concentration of at least $10^{19}$ atoms per cubic centimeter.

8. The method of claim 7 wherein said third region is compensated by about $10^{15}$ to about $10^{17}$ atoms per cubic centimeter of gold to said substantially no-conductivity type condition.

9. The method of claim 8 wherein said second region is diffused in a pattern defining said third region laterally disposed thereto with a width having a dimension less than the diffusion length thereof.

10. The method of claim 7 wherein said second region is diffused in a pattern defining said third region laterally adjacent thereto with a width having a dimension less than the diffusion length thereof.

11. The method of claim 1 including diffusing a dopant of said first conductivity type A. within said second region in spaced relationship to the periphery thereof, and B. in a pattern forming a fourth discrete region of said first conductivity type in PN-relationship with said third region.

12. The method of claim 11, wherein said third region laterally disposed between said first and second regions is compensated by about $10^{15}$ and $10^{17}$ atoms per cubic centimeters of gold to said substantially no-conductivity type condition.

13. The method of claim 12, wherein said second region is diffused in a pattern defining said third region laterally adjacent thereto with a width having a dimension less than the diffusion length thereof.

14. The method of claim 11, wherein said second region is diffused in a pattern defining said third region laterally adjacent thereto with a width having a dimension less than the diffusion length thereof.

15. A method of fabricating semiconductor devices from a silicon semiconductor substrate of P+ type conductivity, comprising:

A. forming of said substrate a surface layer of an N-type conductivity,

B. diffusing into a first portion of said layer a dopant of P+ conductivity to form a first discrete region of said P+ conductivity for extension thereof into the P+ conductivity of said substrate in a pattern circumscribing a second portion of said layer;

C. diffusing in a third portion of said layer contained within said second portion and spaced from said first portion a dopant of N+ type conductivity to form a second discrete region of said N+ type conductivity for extension in PN-relationship to the said P+ type conductivity region of said substrate and D. compensating with gold impurities the remainder of said second portion of said layer laterally contiguous between said first and second regions, to a substantially intrinsic no-conductivity type third region.

16. The method of claim 15 wherein said second region is diffused in a pattern defining said third region laterally adjacent thereto with a width having a dimension less than the diffusion length thereof.

17. The method of claim 15 wherein

A. the first conductivity type region of said substrate is doped to an impurity concentration of about $10^{19}$ atoms per cubic centimeter;

B. said layer is doped to an impurity concentration of about $10^{12}$ to $10^{13}$ atoms per cubic centimeter;

C. said first region is doped to an impurity concentration of about $10^{19}$ atoms per cubic centimeter;

D. said second region is doped to an impurity concentration of about $10^{21}$ atoms per cubic centimeter; and E. said third region is compensated by about $10^{15}$ to about $10^{17}$ atoms per cubic centimeter of gold to said substantially no-conductivity type condition.

18. The method of claim 17 wherein said second region is diffused in a pattern defining said third region laterally disposed thereto with a width having a dimension less than the diffusion length thereof.

19. The method of claim 15 wherein said third region laterally disposed between said first and second regions is compensated with gold to a concentration of about $10^{15}$ to about $10^{17}$ atoms per cubic centimeter to said substantially no-conductivity type condition.

20. The method of claim 19 wherein said third region is diffused in a pattern defining said third region laterally disposed said first and second regions with a width having a dimension less than the diffusion length thereof.

21. The method of claim 15 wherein said second region and the first conductivity type region of said substrate are doped with an impurity concentration of at least $10^{19}$ atoms per cubic centimeter.

22. The method of claim 21 wherein said third region is compensated by about $10^{15}$ to about $10^{17}$ atoms per cubic centimeters of gold to said substantially no-conductivity type condition.

23. The method of claim 22 wherein said second region is diffused in a pattern defining said third region laterally disposed thereto with a width having a dimension less than the diffusion length thereof.

24. The method of claim 21 wherein said second region is diffused in a pattern defining said third region laterally adjacent thereto with a width having a dimension less than the diffusion length thereof.

25. The method of claim 15 including diffusing a dopant of P+ type conductivity

A. within said second region is in spaced relationship to the periphery thereof, and B. in a pattern forming a fourth discrete region of said first conductivity type in PN-relationship with said third region.

26. The method of claim 25 wherein said third region laterally disposed between said first and second regions is compensated by about $10^{15}$ to about $10^{17}$ atoms per cubic centimeter of gold to said substantially no-conductivity condition.

27. The method of claim 26 wherein said second region is diffused in a pattern defining said third region laterally adjacent thereto with a width having a dimension less than the diffusion length thereof.

28. The method of claim 25 wherein said second region is diffused in a pattern defining said third region laterally adjacent thereto with a width having a dimension less than the diffusion length thereof.

29. A method of fabricating semiconductor devices from a silicon semiconductor substrate of a first conductivity type comprising:

A. growing an epitaxial silicon layer of a second conductivity type on a surface of said substrate;

B. diffusing into a first portion of said layer a dopant of said first conductivity type to form a first discrete region of said first conductivity type for establishing an extension thereof into the first conductivity type region of said substrate;

C. diffusing into a second portion of said layer, spaced from said first portion, an impurity of said second conductivity type to form a second discrete region of a second conductivity type for extension thereof into PN-relationship with the first conductivity type region of said substrate; and D. compensating with gold, a third portion of said layer laterally intermediate and contiguous with said first and second portions, into an intrinsic third region of substantially no-conductivity type.

30. The method of claim 29 wherein said third region is compensated by about $10^{15}$ to about $10^{17}$ atoms per cubic centimeter of gold to said substantially no-conductivity type condition.

31. The method of claim 30 wherein said second region is diffused in a pattern defining said third region laterally adjacent thereto and said first region with a width having a dimension less than the diffusion length thereof.

32. The method of claim 29 wherein said second region and the first conductivity type region of said substrate are doped with an impurity concentration of at least $10^{19}$ atoms per cubic centimeter.

33. The method of claim 32 wherein said third region is compensated by about $10^{15}$ to about $10^{17}$ atoms per cubic centimeter of gold to said substantially no-conductivity type condition.

34. The method of claim 33 wherein said second region is diffused in a pattern defining said third region laterally adjacent thereto and said first region with a width having a dimension less than the diffusion length thereof.

35. The method of claim 29 wherein (a) said first region is diffused in a pattern circumscribing a section of said layer with (b) said second region diffused in said section in a pattern spaced from said first region and defining said third region intermediate said first and second region.

36. The method of claim 35 wherein said third region is compensated by about $10^{15}$ to about $10^{17}$ atoms per cubic centimeter of gold to said substantially no-conductivity type condition.

37. The method of claim 36 wherein said second region is diffused in a pattern defining said third region laterally adjacent thereto with a width having a dimension less than the diffusion length thereof.

38. The method of claim 35 including diffusing a dopant of said first conductivity type, (a) within said second region in spaced relationship from the periphery thereof, (b) in a pattern forming a fourth discrete region of said first conductivity type in PN-relationship with said third region.

39. The method of claim 38 wherein said second region and the first conductivity region of said substrate are doped with an impurity concentration of at least $10^{19}$ atoms per cubic centimeter.

40. The method of claim 39 wherein said second region is diffused in a pattern defining said third region laterally adjacent thereto with a width having a dimension less than the diffusion length thereof.

41. The method of claim 33 wherein said third region is compensated by about $10^{15}$ to about $10^{17}$ atoms per cubic centimeter of gold to said substantially no-conductivity type condition.

42. The method of claim 41 wherein said second region is diffused in a pattern defining said third region laterally adjacent thereto with a width having a dimension less than the diffusion length thereof.

43. A method of forming semiconductor devices from a silicon substrate of an P+ type conductivity comprising:

A. growing an epitaxial layer of an N+ type conductivity on a surface of said substrate;

B. diffusing into a first portion of said layer, a P+ type conductivity first discrete region for establishing an extension thereof to said substrate;

C. diffusing into a second portion of said layer an impurity of N-type conductivity to form a second discrete region of (a) N+ type conductivity and (b) spaced from said first region for establishing a PN-junction with the P+ conductivity type region of said substrate; and D. compensating with gold, a third portion of said layer, laterally intermediate and contiguous with said first and second regions into an intrinsic third region of substantially no-conductivity type.

44. The method of claim 43 wherein said third region is compensated by about $10^{15}$ to about $10^{17}$ atoms per cubic centimeter of gold to said substantially no-conductivity type condition.

45. The method of claim 44 wherein said second region is diffused in a pattern defining said third region laterally adjacent thereto with a width having a dimension less than the diffusion length thereof.

46. The method of claim 43 wherein said second region and the first conductivity type region of said substrate are doped with an impurity concentration of at least $10^{19}$ atoms per cubic centimeter.

47. The method of claim 46 wherein said third region is compensated by about $10^{15}$ to about $10^{17}$ atoms per cubic centimeter of gold to said substantially no-conductivity type condition.

48. The method of claim 47 wherein said second region is diffused in a pattern defining said third region laterally adjacent thereto with a width having a dimension less than the diffusion length thereof.

49. The method of claim 43 wherein (a) said first region is diffused in a pattern circumscribing a section of said layer with (b) said second region diffused in said section in a pattern defining said third region intermediate said first and second regions.

50. The method of claim 49 wherein said third region is compensated by about $10^{15}$ to about $10^{17}$ atoms per cubic centimeter of gold to said substantially no-conductivity type condition.

51. The method of claim 50 wherein said second region is diffused in a pattern defining said third region laterally adjacent thereto with a width having a dimension less than the diffusion length thereof.

52. The method of claim 49 wherein said second region and the first conductivity region of said substrate are doped with an impurity concentration of at least $10^{19}$ atoms per cubic centimeter.

53. The method of claim 52 wherein said second region is diffused in a pattern defining said third region laterally adjacent thereto with a width having a dimension less than the diffusion length thereof.

54. The method of claim 53 wherein said third region is compensated by about $10^{15}$ to about $10^{17}$ atoms per cubic centimeter of gold to said substantially no-conductivity type condition.

55. The method of claim 52 wherein said second region is diffused in a pattern defining said third region laterally adjacent thereto with a width having a dimension less than the diffusion length thereof.

56. The method of claim 55 wherein said second region is diffused in a pattern defining said third region laterally adjacent thereto with a width having a dimension less than the diffusion length thereof.

* * * * *